(12) United States Patent
Tago et al.

(10) Patent No.: US 10,712,381 B2
(45) Date of Patent: Jul. 14, 2020

(54) INSERTION POSITION CORRECTION IN AN ELECTRONIC COMPONENT INSERTION DEVICE

(71) Applicant: TAIYO YUDEN CO., LTD., Tokyo (JP)

(72) Inventors: Hideaki Tago, Tokyo (JP); Koji Saito, Tokyo (JP); Naoki Matsuda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 194 days.

(21) Appl. No.: 15/934,724

(22) Filed: Mar. 23, 2018

(65) Prior Publication Data

US 2018/0334334 A1     Nov. 22, 2018

(30) Foreign Application Priority Data

May 16, 2017   (JP) ................................ 2017-097123
Jan. 22, 2018   (JP) ................................ 2018-007850

(51) Int. Cl.
  *G01R 31/28*   (2006.01)
  *H01L 21/67*   (2006.01)
(52) U.S. Cl.
  CPC .... *G01R 31/2813* (2013.01); *H01L 21/67132* (2013.01)
(58) Field of Classification Search
  CPC .... B65B 15/04; B65G 47/14; G01R 31/2813; H01L 21/67132; H01L 21/6836; H01L 24/50; H01L 24/79; H01L 24/86; H01L 2224/50; H01L 2224/79; H01L 2224/86; H05K 13/0084
  USPC .................. 257/E23.034, E23.055; 382/151; 438/464
  See application file for complete search history.

(56) References Cited

FOREIGN PATENT DOCUMENTS

| JP | H11-292252 A | 10/1999 |
|---|---|---|
| JP | 2002-029505 A | 1/2002 |
| JP | 2006-168754 A | 6/2006 |

*Primary Examiner* — Saul Rodriguez
*Assistant Examiner* — Brendan P Tighe
(74) *Attorney, Agent, or Firm* — Chen Yoshimura LLP

(57) ABSTRACT

A device for inserting n number of the electronic components into n number of housing recess in a carrier tape at once includes an imaging device that images, at an imaging position provided at an upstream side of the insertion position, a portion of the carrier tape that contains the n number of housing recesses; and a processor that determines, on the basis of an image captured by the imaging device, a two-dimensional position of each of the n number of housing recesses contained in the image relative to a reference point in the image, and that causes a two-dimensional position of the insertion position for the n number of the housing recesses that have been imaged by the imaging device to be corrected in accordance with the captured image so as to mitigate positional deviations of the n number of the housing recesses in the tape.

16 Claims, 14 Drawing Sheets

INSERTION POSITION CORRECTION IN AN ELECTRONIC COMPONENT INSERTION DEVICE

BACKGROUND OF THE INVENTION

Technical Field

The present invention relates to an electronic component insertion device and an electronic component insertion method for collectively inserting n number of electronic components (where n is an integer of 2 or more) into n number of housing recesses in carrier tape at an insertion position.

Background Art

Band-shaped carrier tape, which is used when manufacturing electronic component storage tape, has housing recesses for electronic components at an equal pitch in the length direction. After the electronic components are inserted into the housing recesses at a prescribed insertion position, a cover tape for closing the housing recesses is attached to the carrier tape, thus forming electronic component storage tape. The electronic component storage tape is used by being set to a tape feeder that discharges the electronic components from the housing recesses while peeling away the cover tape, for example.

When inserting the electronic components into the housing recesses, the conventionally used method has been to insert the electronic components into the housing recesses one-by-one, but there has been recent research into methods for collectively inserting a plurality of electronic components into the same number of housing recesses in order to enhance insertion efficiency of the electronic components, or namely, to enhance manufacturing efficiency of the electronic component storage tape (see Patent Documents 1 to 3 below).

However, the electronic components that are inserted, such as capacitors, inductors, or varistors, are becoming smaller due to customer-driven demand, and currently it is common to use electronic components with maximum basic dimensions of 0.6 mm or lower; e.g., for a generally cuboid electronic component, the length (basic dimension) is commonly 0.6 mm or below and the width (basic dimension) is 0.3 mm or below. Furthermore, following the decreasing size of electronic components, there is also commercially available carrier tape that has housing recesses corresponding to such small electronic components.

The size (including dimensional tolerance) of the housing recesses in the carrier tape is determined in consideration of the basic dimensions and dimensional tolerance of the electronic components to be inserted; thus, even if the electronic components are small, there is no particular problem with individually inserting each electronic component into the housing recesses.

However, the size of the housing recesses corresponding to the compact electronic components is small as would be expected, and there is also tolerance in the two-dimensional position of each housing recess (position in the length direction and width direction of the carrier tape); therefore, when using a method in which a plurality of electronic components are collectively inserted into the same number of housing recesses as described above, it is necessary to give sufficient consideration to variation in the two-dimensional position of each of the plurality of housing recesses.

In other words, when collectively inserting a plurality of electronic components into the same number of housing recesses, there is a risk that variation in the two-dimensional position of each of the plurality of housing recesses may prevent smooth insertion due to several of the electronic components contacting the inner side surfaces of the housing recesses. Namely, technical considerations are necessary so that collective insertion can be performed more smoothly when collectively inserting a plurality of electronic components into the same number of housing recesses, particularly if the electronic components are small.

RELATED ART DOCUMENTS

Patent Documents

Patent Document 1: Japanese Patent Application Laid-Open Publication No. H11-292252
Patent Document 2: Japanese Patent Application Laid-Open Publication No. 2002-029505
Patent Document 3: Japanese Patent Application Laid-Open Publication No. 2006-168754

SUMMARY OF THE INVENTION

An object to be achieved by the present invention is to provide an electronic component insertion device and an electronic component insertion method that allow smoother collective insertion when collectively inserting a plurality of electronic components into the same number of housing recesses in carrier tape, even if the electronic components are small.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a device for inserting a plurality of electronic components into a plurality of housing recesses of a carrier tape, the housing recesses being provided at an equal pitch in a lengthwise direction of the carrier tape, the device being configured to insert n number of the electronic components into n number of the housing recess in the carrier tape at once, where n is an integer of two or more, the device including: a motor that intermittently moves the carrier tape such that every n number of the housing recesses is positioned at an insertion position at once so as to receive n number of the electronic components into the n number of the housing recesses at once at the insertion position; an imaging device that images, at an imaging position provided at an upstream side of the insertion position, a portion of the carrier tape that contains the n number of housing recesses that are to be inserted with n number of the electronic components at once when moved to the insertion position; and a processor that determines, on the basis of an image captured by the imaging device, a two-dimensional position of each of the n number of housing recesses contained in the image relative to a reference point in the image, and calculates a positional deviation in the two-dimensional position of each of the n number of housing recesses from a prescribed design position, the processor further deriving common correction values that are to be applied commonly to the n number of the housing recesses in the image in accordance with the calculated positional deviations, wherein the processor further causes a two-dimensional position of the insertion position for the n number of the housing recesses that have been imaged by the imaging device to be corrected in accordance with the derived common correction values so as to mitigate or offset the positional deviations of the n number of the housing recesses before the n number of the housing recesses receive the n number of the electronic components so that the n number of the electronic components are inserted into the n number of the housing recesses at the corrected insertion position.

In another aspect, the present disclosure provides a method for inserting a plurality of electronic components into a plurality of housing recesses of a carrier tape, the housing recesses being provided at an equal pitch in a lengthwise direction of the carrier tape, the method being for inserting n number of the electronic components into n number of the housing recess in the carrier tape at once, where n is an integer of two or more, the method including: intermittently moving the carrier tape by a motor such that every n number of the housing recesses is positioned at an insertion position at once so as to receive n number of the electronic components into the n number of the housing recesses at once at the insertion position; imaging by an imaging device, at an imaging position provided at an upstream side of the insertion position, a portion of the carrier tape that contains the n number of housing recesses that are to be inserted with n number of the electronic components at once when moved to the insertion position; determining by a processor, on the basis of an image captured by the imaging device, a two-dimensional position of each of the n number of housing recesses contained in the image relative to a reference point in the image; calculating by the processor a positional deviation in the two-dimensional position of each of the n number of housing recesses from a prescribed design position; deriving by the processor common correction values that are to be applied commonly to the n number of the housing recesses in the image in accordance with the calculated positional deviations; and causing by the processor a two-dimensional position of the insertion position for the n number of the housing recesses that have been imaged by the imaging device to be corrected in accordance with the derived common correction values so as to mitigate or offset the positional deviations of the n number of the housing recesses before the n number of the housing recesses receive the n number of the electronic components so that the n number of the electronic components are inserted into the n number of the housing recesses at the corrected insertion position.

The electronic component insertion device and electronic component insertion method of the present invention make it possible to perform collective insertion more smoothly when inserting a plurality of electronic components into the same number of housing recesses in carrier tape, even if the electronic components are small.

Furthermore, the electronic component insertion device and electronic component insertion method of the present invention makes it possible to perform highly efficient insertion of electronic components into housing recesses in carrier tape and to manufacture electronic component storage tape with high efficiency.

It is to be understood that both the foregoing general description and the following detailed description are exemplary and explanatory, and are intended to provide further explanation of the invention as claimed.

DETAILED DESCRIPTION OF EMBODIMENTS

Figure 1A:
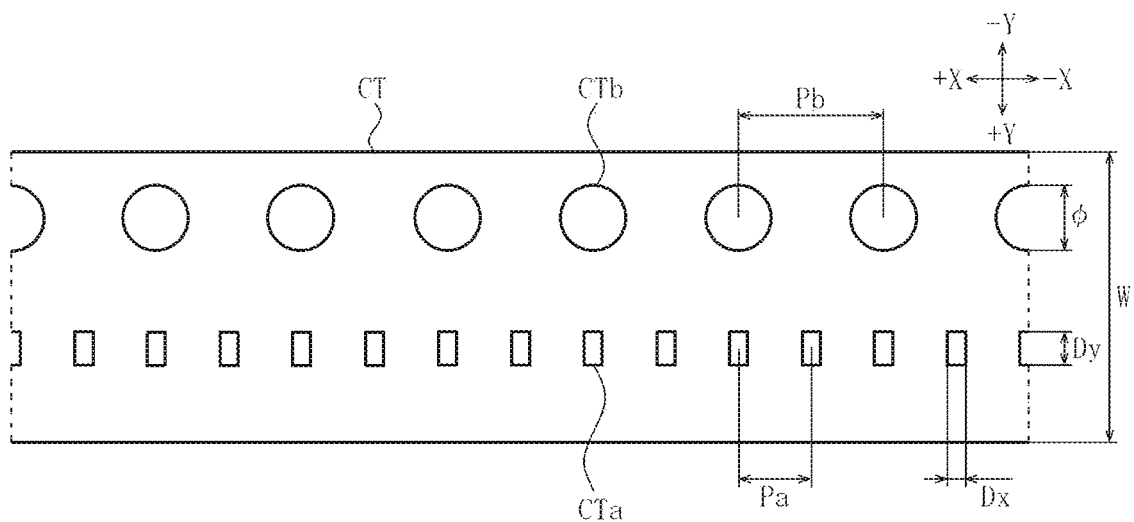
FIG. 1A is a view showing one example of carrier tape.

One example of carrier tape and one example of an electronic component to be inserted will be explained first with reference to FIG. 1.

The carrier tape CT shown in FIG. 1A has a band-like shape and has generally cuboid housing recesses CTa for electronic components at an equal pitch Pa in the length direction (the X direction in the drawing; hereinafter, the length direction is referred to as the X direction). The carrier tape has feed holes CTb in the X direction at an equal pitch Pb differing from the pitch Pa of the housing recesses CTa with gaps between the housing recesses CTa and feed holes in the width direction (the Y direction in the drawing; hereinafter, the width direction is referred to as the Y direction). There are no particular limitations to the working type of the carrier tape CT; a carrier tape made via compression working, a carrier tape made via emboss working, or the like can be used as appropriate.

Figure 1B:
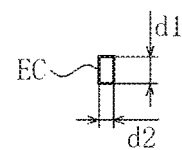
FIG. 1B is a view showing one example of an electronic component to be inserted.

The electronic component shown in FIG. 1B has a generally cuboid shape, the basic dimensions thereof having a dimensional relationship whereby length $d1 >$ width d2=height d3 (not shown). There are no particular limitations to the type of electronic component EC; the electronic component can be a capacitor, inductor, varistor, or the like, for example.

For reference, the Y direction dimension W of the carrier tape which is a base of FIG. 1A is 4 mm±0.05 mm. The Y direction dimension Dy of each housing recess CTa is 0.46 mm±0.02 mm, with an X direction dimension Dx of 0.25 mm±0.02 mm, and a dimension Dz in the direction orthogonal to the Y direction and X direction (depth, not shown) of 0.25 mm±0.02 mm. Moreover, the diameter y of each feed hole CTb is 0.9 mm±0.05 mm. The pitch Pa of the housing recesses CTa is 1 mm±0.02 mm, and the pitch Pb of the feed holes CTb is 2 mm±0.04 mm. The Y direction gap (reference character not shown) between the center of each housing recess CTa and the center of each feed hole CTb is 1.8 mm±0.02 mm. Furthermore, the electronic component EC is a base of FIG. 1B is referred to as 0402, and has a length d1 of 0.4 mm±0.02 mm, a width d2 of 0.2 mm±0.02 mm, and height d3 (not shown) of 0.2 mm±0.02 mm.

Next, a configuration of an electronic component insertion device that uses the carrier tape CT shown in FIG. 1A and the electronic component EC shown in FIG. 1B will be described with reference to FIGS. 2 to 5B.

The electronic component insertion device moves the carrier tape CT (see FIG. 1A) intermittently in the +X direction, and each time three housing recesses CTa in the carrier tape CT stop at an insertion position IP, three electronic components EC (see FIG. 1B) are collectively inserted into the three housing recesses CTa. The intermittent movement of the carrier tape CT is guided by a guide rail (not shown).

Figure 2:
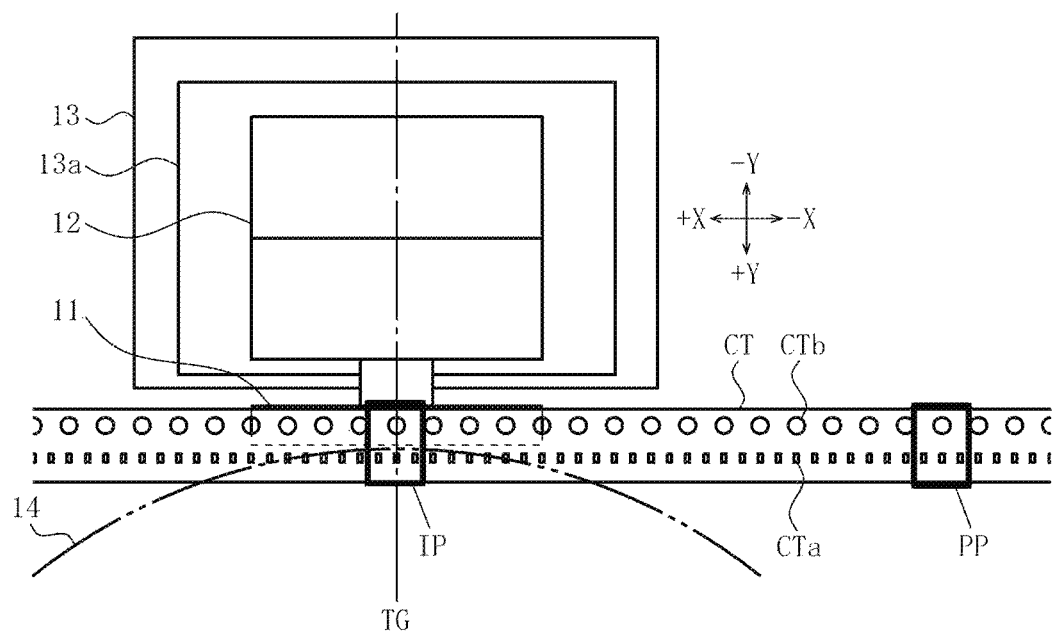
FIG. 2 is a partial view of an electronic component insertion device of the present invention.
Figure 3:
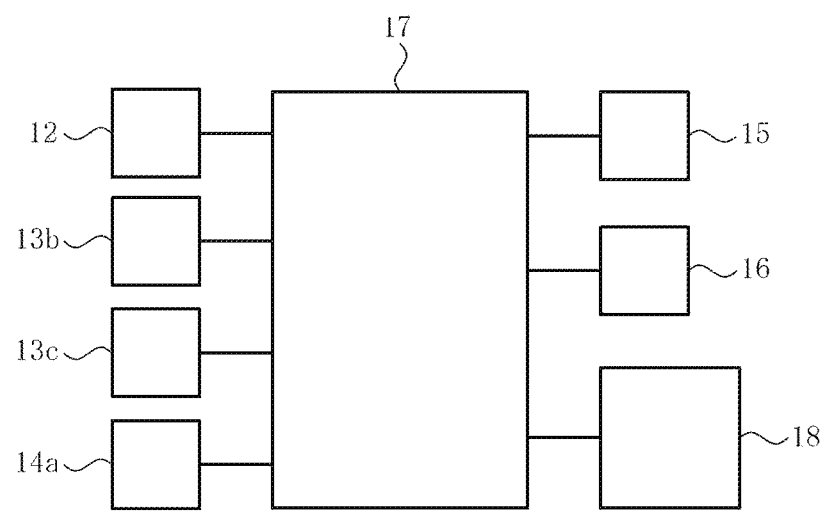
FIG. 3 is a view showing the operation control system of the electronic component insertion device shown in FIG. 2.
Figure 4A:
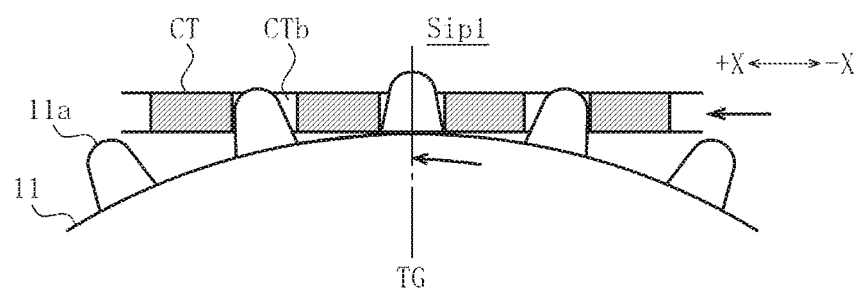
FIGS. 4A and 4B are views for explaining a feed operation for carrier tape when collectively inserting three electronic components into three housing recesses.
Figure 4B:
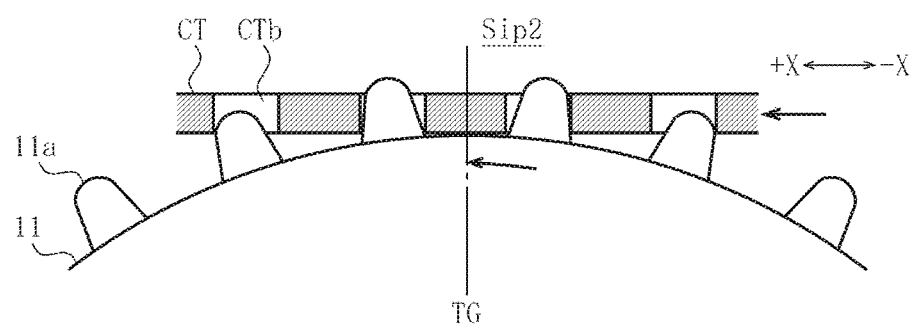

Reference character 12 in FIGS. 2 and 3 is a motor for intermittently moving the carrier tape CT such that three of the housing recesses CTa in the carrier tape CT successively stop at the insertion position IP. As shown in FIG. 2 and FIGS. 4A and 4B, the shaft (reference character not shown) of the intermittent movement motor 12 has connected thereto the center of an intermittent movement sprocket 11, which has on the outer peripheral surface thereof protrusions 11a that can engage with the feed holes CTb in the carrier tape CT at intervals of equal angles. Several of the protrusions 11a of the intermittent movement sprocket 11 are engaged with the feed holes CTb in the carrier tape CT.

The pitch Pa of the housing recesses CTa in the carrier tape CT is ½ of the pitch Pb of the feed holes CTb; thus, as shown in FIGS. 4A and 4B, the carrier tape CT and intermittent movement sprocket 11 alternately stop in two types of states (a first stop state Sip1 and a second stop state Sip2, described later) at the insertion position IP.

Figure 5A:
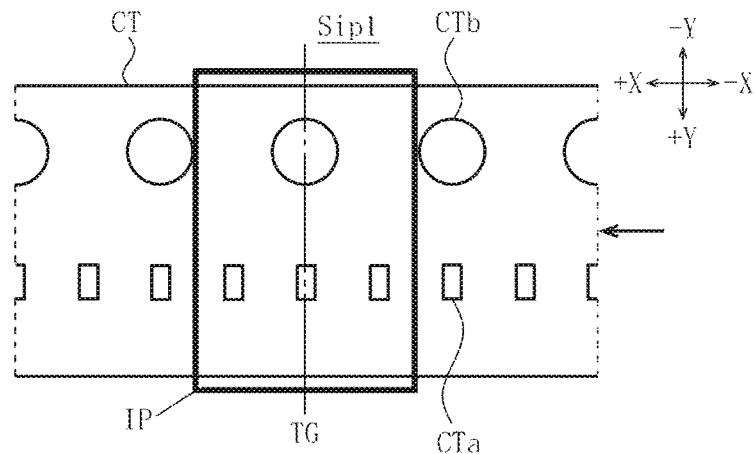
FIG. 5A is a view showing a first stop state of the carrier tape shown in FIG. 2 at an insertion position.
Figure 5B:
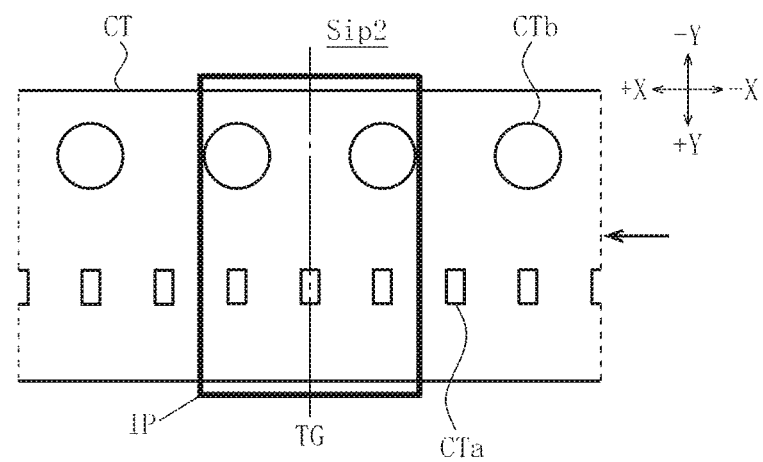
FIG. 5B is a view showing a second stop state of the same.

FIG. 4A and FIG. 5A show the first stop state Sip1, and in this first stop state Sip1, the carrier tape CT stops such that the center of one protrusion 11a of the intermittent movement sprocket 11 is aligned with a target position TG (the position corresponding to the center in the X direction of the insertion position IP). FIG. 4B and FIG. 5B show the second stop state Sip2, and in this second stop state Sip2, the carrier tape CT stops such that the center of two protrusions 11a of the intermittent movement sprocket 11 is aligned with the target position TG. As shown in FIG. 5A and FIG. 5B, in the first stop state Sip1 and the second stop state Sip2, there is no difference in that the three housing recesses CTa are stopped at the insertion position IP in the same manner.

Reference character 13 in FIG. 2 is a two-dimensional movement mechanism such as an XY table, which has a movable part 13a that can move in the X direction and the Y direction, and the intermittent movement motor 12 is fixed to the movable part 13a. Reference character 13b in FIG. 3 indicates an X-direction movement motor of the two-dimensional movement mechanism 13, and reference character 13c indicates a Y-direction movement motor of the two-dimensional movement mechanism 13. The two-dimensional movement mechanism 13 causes the moving part 13a and the intermittent movement motor 12 attached thereto to move in the X direction and Y direction via actuation of the X direction movement motor 13b and Y direction movement motor 13c, and this allows the intermittent movement sprocket 11 connected to the shaft of the intermittent movement motor 12 to be moved in the X direction and Y direction.

In other words, in the first stop state Sip1 and second stop state Sip2 shown in FIGS. 4A and 4B and FIGS. 5A and 5B, several of the protrusions 11a of the intermittent movement sprocket 11 are engaged with the feed holes CTb in the carrier tape CT. Therefore, the moving of the intermittent movement sprocket 11 in the X direction and Y direction via the two-dimensional movement mechanism 13 makes it possible to displace at least the portion of the carrier tape CT corresponding to the insertion position IP and to change the two-dimensional positions (X direction and Y direction positions) of the three housing recesses CTa corresponding to the insertion position IP.

Reference character 14 in FIG. 2 is a component conveyance disk for conveying the electronic components EC to the insertion position IP. Although not shown in the drawing, component holding parts made of rectangular grooves, rectangular holes, or the like for accommodating the electronic components EC are provided on the outer periphery of the component conveyance disk 14 at an interval matching the pitch Pa of the housing recesses CTa in the carrier tape CT. The electronic component insertion device shown in FIG. 2 collectively inserts three electronic components EC into three housing recesses CTa in the carrier tape CT at the insertion position IP; thus, the total number of component holding parts of the component conveyance disk 14 is a multiple of three, and the orientation of the holding parts for every three components matches the orientation of the three housing recesses CTa that are stopped at the insertion position IP. Furthermore, although not shown in the drawings, air suction passages for maintaining the holding of the electronic components EC to the component holding parts are provided on the component conveyance disk 14, and the aggregate part of the air suction passages is connected to an air suction device via an air tube.

Reference character 14a in FIG. 3 is a motor for intermittently rotating the component conveyance disk 14 such that three of the component holding parts of the component conveyance disk 14 successively stop at the insertion position IP. The center of the component conveyance disk 14 is connected to the shaft (not shown) of the intermittent rotation motor 14a.

Reference character 15 in FIG. 3 is an insertion drive source for collectively inserting the three electronic components EC held by the three component holding parts into the three housing recesses CTa in the carrier tape CT each time three of the component holding parts of the component conveyance disk 14 stop at the insertion position IP. Although not shown, the insertion drive source is preferably a solenoid with three component insertion pins corresponding to the electronic components EC held by the three component holding parts stopped at the insertion position IP. An air discharge device can also be used for the insertion drive source, and in such a case, the leading ends of the air tube connected to the air discharge device would be set to face the electronic components EC held by the three component holding parts stopped at the insertion position IP, and the three electronic components EC held by the three component holding parts would be collectively inserted into the three housing recesses CTa in the carrier tape CT by discharged air.

Although not shown, a component supplying device for supplying the electronic components EC to the component holding parts is provided to the component conveyance disk 14. The component supplying device may successively supply the electronic components EC to the component holding parts from the leading end of a linear feeder connected to a ball feeder, or the component supplying device may successively supply the electronic components EC in a bulk state (a state in which the orientations of the components are not the same) to the component holding parts by using the weight of the components themselves, air, or the like.

The reference character PP in FIG. 2 is an imaging position that is set at an upstream side (in the −X direction) of the insertion position IP. Reference character 16 in FIG. 3 is a camera for imaging the carrier tape CT within an imaging area IA (see FIGS. 7A and 7B) containing the three housing recesses CTa at the imaging position PP, and the camera has an imaging element such as MOS, CMOS, CCD, or the like embedded therein. Although not shown, an illumination apparatus for illuminating the carrier tape CT at the time of imaging is disposed on or around the camera 16.

Figure 7A:
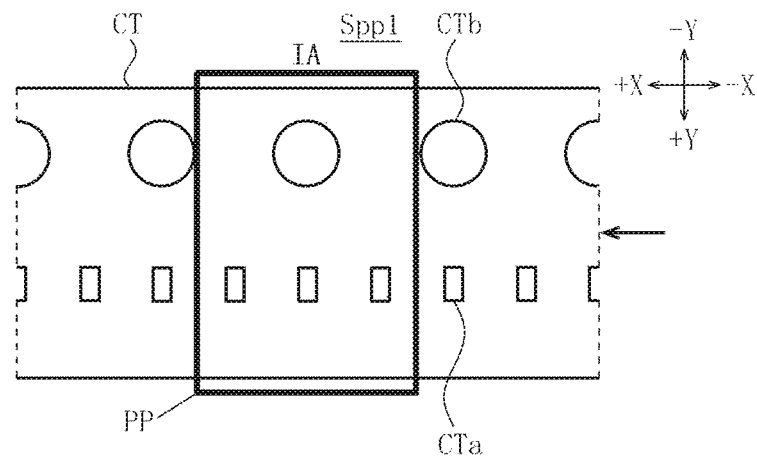
FIG. 7A is a view showing a first stop state of the carrier tape shown in FIG. 2 at an imaging position.
Figure 7B:
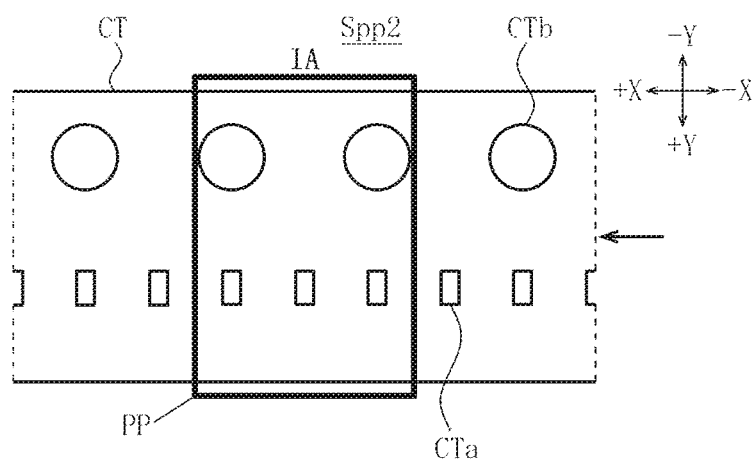
FIG. 7B is a view showing a second stop state of the same.

As described above, the electronic component insertion device shown in FIG. 2 collectively inserts three electronic components EC into three housing recesses CTa in the carrier tape CT at the insertion position IP; thus, between the three housing recesses CTa of the imaging position PP and the three housing recesses CTa of the insertion position IP, there exists a number of housing recesses CTa that is a multiple of three (27 in FIG. 2). The imaging position PP may be set to a position that is closer to the insertion position IP than the position shown in FIG. 2, or the imaging position may be set to a position further away from the insertion position IP than the position shown in FIG. 2. For convenience, FIGS. 7A and 7B depict the size of the imaging area IA as being the same as those of the rectangular frames indicating the insertion position IP and imaging position PP, but the imaging area IA may differ in size from the rectangular frames indicating the insertion position IP and imaging position PP.

Reference character 17 in FIG. 3 is a control unit having a microcomputer, various types of drivers, and various types of interfaces, and programs for operation control are stored in a ROM. Reference character 18 in FIG. 3 is a storage unit for temporarily storing images captured by the camera 16, and the storage unit 18 also temporarily stores common correction amounts and the like, which will be described later.

The component conveyance disk 14 of the electronic component insertion device may have a horizontal or generally horizontal orientation, or an orientation whereby the rotation axis thereof is inclined in an acute angle range with respect to a vertical line. In any case, the desired operation can be achieved by setting the top surface of the carrier tape CT, the rotation axis of the intermittent movement sprocket 11, and the top surface of the movable part 13a of the two-dimensional movement mechanism 13 shown in FIG. 2 to the same orientation as the component conveyance disk 14.

Next, the basic operation of component insertion in the electronic component insertion device will be described with reference to FIGS. 2 to 5B.

The intermittent movement sprocket 11 shown in FIG. 2 and FIGS. 4A and 4B and the component conveyance disk 14 shown in FIGS. 4A and 4B perform intermittent rotation synchronously. The electronic component insertion device shown in FIG. 2 collectively inserts three electronic components EC into the three housing recesses CTa in the carrier tape CT at the insertion position IP; thus, the carrier tape CT is intermittently moved such that three housing recesses CTa successively stop at the insertion position IP, or in other words, the carrier tape is repeatedly moved and stopped in the +X direction. The component conveyance disk 14 is intermittently moved such that three holding parts successively stop at the insertion position IP, or in other words, the component conveyance disk is repeatedly rotated and stopped in the counter-clockwise direction in FIG. 2.

As shown in FIG. 2, and FIGS. 4A through 5B, when the carrier tape CT and component conveyance disk 14 stop, the insertion drive source 15 operates to cause the electronic components EC held by the three component holding parts stopped at the insertion position IP to be collectively inserted into the three housing recesses CTa stopped at the insertion position IP. When the collective insertion is complete, the carrier tape CT moves in the +X direction such that the next three housing recesses CTa stop at the insertion position IP, and the component conveyance disk 14 also rotates in the counter-clockwise direction such that the next three component holding parts stop at the insertion position IP. After this, the same collective insertion, moving and stopping of the carrier tape CT, and rotating and stopping of the component conveyance disk 14 are repeated. In other words, an operation whereby three electronic components EC are collectively inserted into three housing recesses CTa in the carrier tape CT at the insertion position IP is repeated.

Next, the operation of position correction in the electronic component insertion device, or namely, an operation for correcting the two-dimensional positions (X direction and Y direction positions) of three housing recesses CTa at a stage before three electronic components EC are collectively inserted into the three housing recesses CTa in the carrier tape CT at the insertion position IP, will be described with reference to FIGS. 6 to 9.

Figure 6:
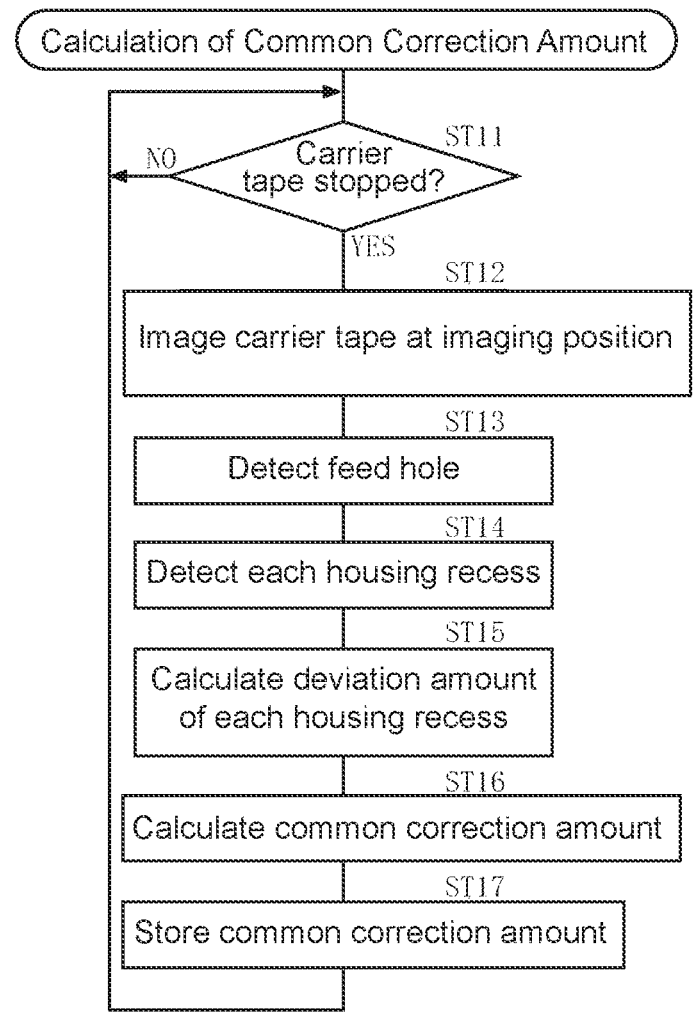
FIG. 6 is a view showing an operation flow when calculating a common correction amount.

As shown in FIGS. 7A and 7B, when the intermittently moving carrier tape CT stops at the imaging position PP, the camera 16 (see FIG. 3) images the carrier tape CT at the imaging position PP with an imaging area IA (see FIGS. 7A and 7B) that contains the three housing recesses CTa (see steps ST11 and ST12 in FIG. 6).

The pitch Pa of the housing recesses CTa in the carrier tape CT is ½ of the pitch Pb of the feed holes CTb; thus, as shown in FIGS. 7A and 7B, the carrier tape CT alternately stops in two states at the imaging position PP (a first stop state Spp1 and a second stop state Spp2, described later).

FIG. 7A shows the first stop state Spp1, and in the first stop state Spp1 the carrier tape CT is stopped such that one feed hole CTb is aligned with a position corresponding to the center of the imaging position PP in the X direction. FIG. 7B shows the second stop state Spp2, and in the second stop state Spp2 the carrier tape CT is stopped such that the center of two feed holes CTb is aligned with a position corresponding to the center of the imaging position PP in the X direction. In both the first stop state Spp1 shown in FIG. 7A and the second stop state Spp2 shown in FIG. 7B, three housing recesses CTa are stopped in the same manner at the imaging position PP and fit within the imaging area IA.

In other words, in step ST12, the first stop state Spp1 shown in FIG. 7A and the second stop state Spp2 shown in FIG. 7B are alternately imaged at the imaging position PP.

When the image obtained in step ST12 is the image of the first stop state Spp1 shown in FIG. 7A, the two-dimensional positions of the three housing recesses CTa and the one feed hole CTb are detected on the basis of the image, and deviation amounts of the two-dimensional position of each housing recess CTa are calculated on the basis of the detected two-dimensional positions. Common correction amounts ($\Delta X$ and $\Delta Y$) that are to be applied commonly to the three housing recesses CTa are calculated on the basis of the calculated deviation amounts, and the calculated common correction amounts are stored (see steps ST13 to ST17 in FIG. 6).

Furthermore, when the image obtained in step ST12 is the image of the second stop state Spp2 shown in FIG. 7B, the two-dimensional positions of the three housing recesses CTa and the two feed holes CTb are detected on the basis of the image, and a deviation amount of the two-dimensional position of each housing recess CTa is calculated on the basis of the detected two-dimensional positions. Common correction amounts that are to be applied commonly to the three housing recesses CTa are calculated on the basis of the calculated deviation amounts, and the calculated common correction amounts are stored (see steps ST13 to ST17 in FIG. 6).

The processes for steps ST13 to ST17 in FIG. 6 will be explained in detail with reference to the example of the image shown in FIGS. 8A and 8B.

Figure 8A:
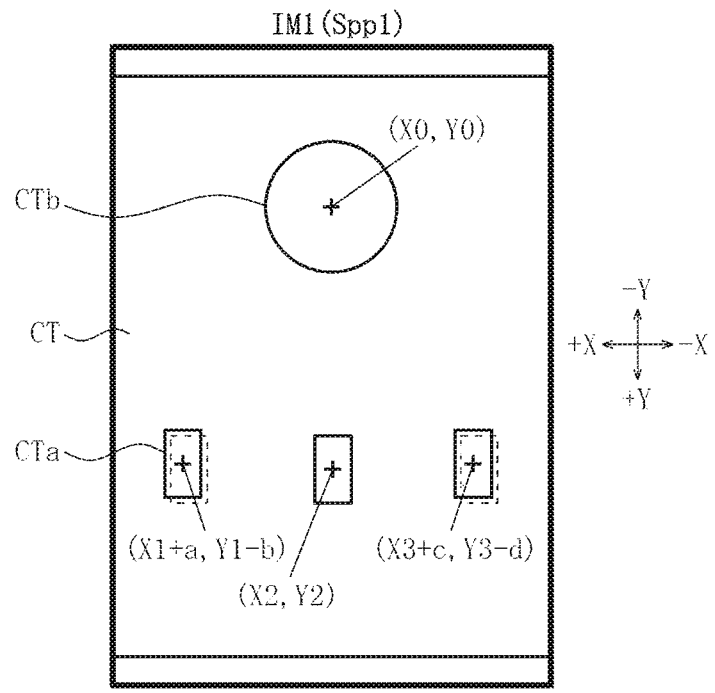
FIG. 8A is a view showing one example of an image obtained in the first stop state shown in FIG. 7A.
Figure 8B:
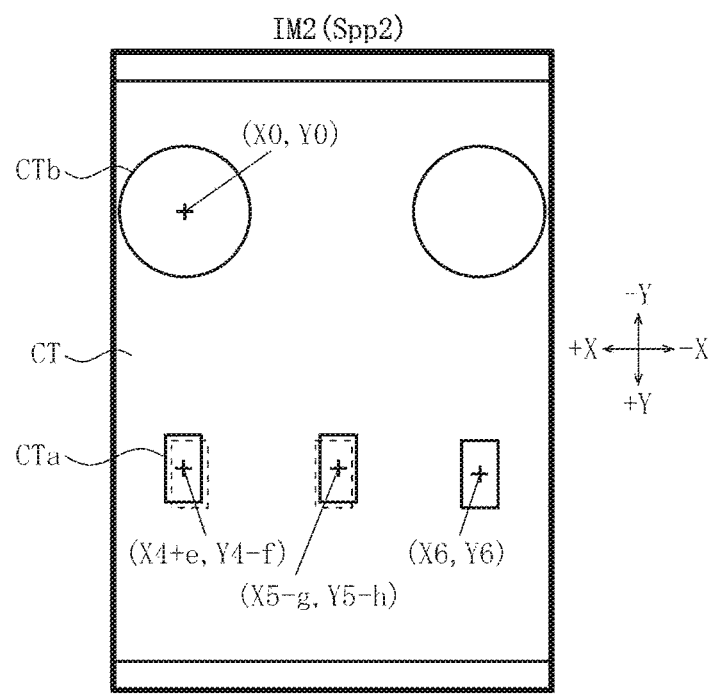
FIG. 8B is a view showing one example of an image obtained in the second stop state shown in FIG. 7BB.

FIG. 8A shows one example of an image IM1 obtained in the first stop state Spp1, and FIG. 8B shows one example of an image IM2 obtained in the second stop state Spp2. In the image IM1 shown in FIG. 8A, among the three housing recesses CTa, the two-dimensional positions of two of the housing recesses CTa on the left side and right side are deviated from an ideal position (see the dotted line, which signifies a position with no deviation). Furthermore, in the image IM2 shown in FIG. 8B, among the three housing recesses CTa, the two-dimensional positions of two of the housing recesses CTa on the left side and in the center are deviated from an ideal position (see the dotted line, which signifies a position with no deviation).

In the case of the image IM1 shown in FIG. 8A, first the two-dimensional positions of the three housing recesses CTa and the one feed hole CTb are detected by a pattern detection method that searches for the same patterns as a template corresponding to each of the housing recesses CTa and the feed hole CTb. Then, with the two-dimensional position (the center position shown by the + mark) of the one feed hole CTb being the origin (X0,Y0) in an XY coordinate system, the two-dimensional position (the center position shown by the + mark) of each of the three housing recesses CTa is calculated in the XY coordinate system in reference to the origin (X0,Y0).

The ideal position (X1,Y1), (X2,Y2), and (X3,Y3) of each of the three housing recesses CTa referenced to the origin (X0,Y0) can be calculated in advance from each basic dimension in the design of the carrier tape CT; thus, the XY coordinates of the two-dimensional position for each of the three housing recesses CTa is preferably calculated such that the deviation amount from each ideal position can be understood. In other words, in the image IM1, the two-dimensional position of the housing recess CTa on the left side is deviated diagonally to the upper left, and thus the XY coordinates thereof are (X1+a,Y1−b). The housing recess CTa in the center has no deviation, and thus the XY coordinates thereof are (X2,Y2). The two-dimensional position of the housing recess CTa on the right side is deviated diagonally to the upper left, and thus the XY coordinates thereof are (X3+c,Y3−d).

A correction amount $\Delta X$ common to the three housing recesses CTa in the X direction is calculated using $\{(+a)\pm(0)+(+c)\}/3$ on the basis of the XY coordinates (X1+a,Y1−b), (X2,Y2), and (X3+c,Y3−d) of each of the three housing recesses CTa. A correction amount $\Delta Y$ common to the three housing recesses CTa in the Y direction is calculated using $\{(−b)\pm(0)+(−c)\}/3$ on the basis of the XY coordinates (X1+a,Y1−b), (X2,Y2), and (X3+c,Y3−d) of each of the three housing recesses CTa. These ($\Delta X,\Delta Y$) are stored as common correction amounts that are to be applied commonly to the three housing recesses CTa contained in the image IM1.

In the case of the image IM2 shown in FIG. 8B, first the two-dimensional positions of three housing recesses CTa and two feed holes CTb are detected using the same pattern detection method as described above. Then, with the two-dimensional position (the center position shown by the + mark) of one feed hole CTb (on the left side in this example) among the two feed holes CTb being the origin (X0,Y0) in an XY coordinate system, the two-dimensional position (the center position shown by the + mark) of each of the three housing recesses CTa is calculated in the XY coordinate system in reference to the origin (X0,Y0).

The ideal position (X4,Y4), (X5,Y5), and (X6,Y6) of each of the three housing recesses CTa referenced to the origin (X0,Y0) can be calculated in advance from each basic dimension in the design of the carrier tape CT; thus, the XY coordinates of the two-dimensional position for each of the three housing recesses CTa is preferably calculated such that the deviation amount from the ideal position can be understood. In other words, in the image IM2, the two-dimensional position of the housing recess CTa on the left side is deviated diagonally to the upper left, and thus the XY coordinates thereof are (X4+e,Y4−f). The housing recess CTa in the center is deviated diagonally to the upper right, and thus the XY coordinates thereof are (X5−g,Y5−h). The housing recess CTa on the right side has no deviation, and thus the XY coordinates thereof are (X6,Y6).

A correction amount $\Delta X$ common to the three housing recesses CTa in the X direction is calculated using $\{(+e)+(−g)\pm(0)\}/3$ on the basis of the XY coordinates (X4+e,Y4−f), (X5−g,Y5−h), and (X6,Y6) of each of the three housing recesses CTa. A correction amount $\Delta Y$ common to the three housing recesses CTa in the Y direction is calculated using $\{(4)+(−h)\pm(0)\}/3$ on the basis of the XY coordinates (X4+e,Y4−f), (X5−g,Y5−h), and (X6,Y6) of each of the three housing recesses CTa. These ($\Delta X,\Delta Y$) are stored as common correction amounts that are to be applied commonly to the three housing recesses CTa contained in the image IM2.

In other words, the carrier tape CT moves intermittently in units of three housing recesses CTa, and thus the common correction amounts ($\Delta X,\Delta Y$) described above are successively stored in units of three housing recesses CTa.

The reason that the two-dimensional position (the center position shown by the + mark) of one feed hole CTb in the image IM1 shown in FIG. 8A is set as the origin (X0,Y0) of the XY coordinate system and that one (the center position shown by the + mark) of the two feed holes CTb in the image IM2 shown in FIG. 8B is set as the origin (X0,Y0) of the XY coordinate system is because the protrusions 11a of the intermittent movement sprocket 11 that performs intermittent movement of the carrier tape CT are engaged with the feed holes CTb in the carrier tape CT, and thus it is easier to ascertain variation in the two-dimensional position of each housing recess CTa when using the two-dimensional position of the feed hole CTb as a reference. In other words, it is based on that the calculation of the deviation amount in the two-dimensional position of the housing recesses CTa being referenced to the two-dimensional position of the feed hole CTb is more suitable for calculation of the deviation amount and calculation of the common correction amount.

Figure 9:
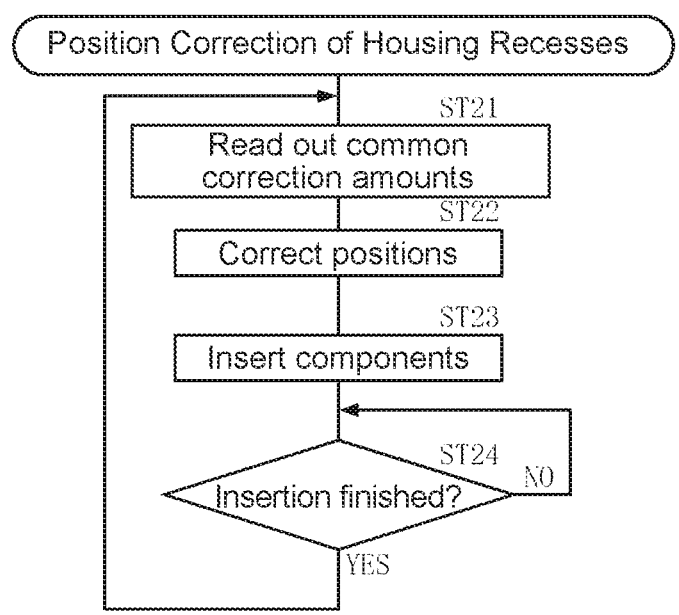
FIG. 9 is a view showing an operation flow for position correction of housing recesses.

When the intermittently moving carrier tape CT stops at the insertion point IP and the collective insertion of three electronic components EC into three housing recesses CTa is complete, the common correction amounts ($\Delta X, \Delta Y$) corresponding to the next three housing recesses CTa are read out from the stored common correction amounts ($\Delta X, \Delta Y$) (see steps ST24 and ST21 in FIG. 9).

Next, before three electronic components EC are collectively inserted into the next three housing recesses CTa, the two-dimensional positions of the three housing recesses CTa are corrected on the basis of the common correction amounts ($\Delta X, \Delta Y$) that have been read out (see step ST22 in FIG. 9). This position correction is performed by moving the intermittent movement sprocket 11 in the X direction and Y direction via the two-dimensional movement mechanism 13 on the basis of the read-out correction amounts ($\Delta X, \Delta Y$), and then, due to such movement, at least the portion of the carrier tape CT corresponding to the insertion position IP being displaced in the X direction and the Y direction in accordance with the common correction amounts ($\Delta X, \Delta Y$).

Next, the three electronic components EC are collectively inserted into the three housing recesses CTa for which the position correction has been performed (see step ST23 in FIG. 9).

The common correction amounts ($\Delta X, \Delta Y$) described above take into consideration the deviation in the two-dimensional position of each of the three housing recesses CTa stopping at the insertion position IP; thus, it is possible to perform extremely smooth collective insertion of three electronic components EC into three housing recesses CTa. Furthermore, even if the two-dimensional position of each of the three housing recesses CTa deviates in a differing aspect from the images IM1 and IM2 shown in FIGS. 8A and 8B, it is still possible to perform extremely smooth collective insertion of three electronic components EC.

Next, with reference to FIGS. 10 to 13, the stop states of the carrier tape at the insertion position and imaging position will be explained for a case in which a number of electronic components other than three is collectively inserted into the same number of housing recesses.

Figure 10:
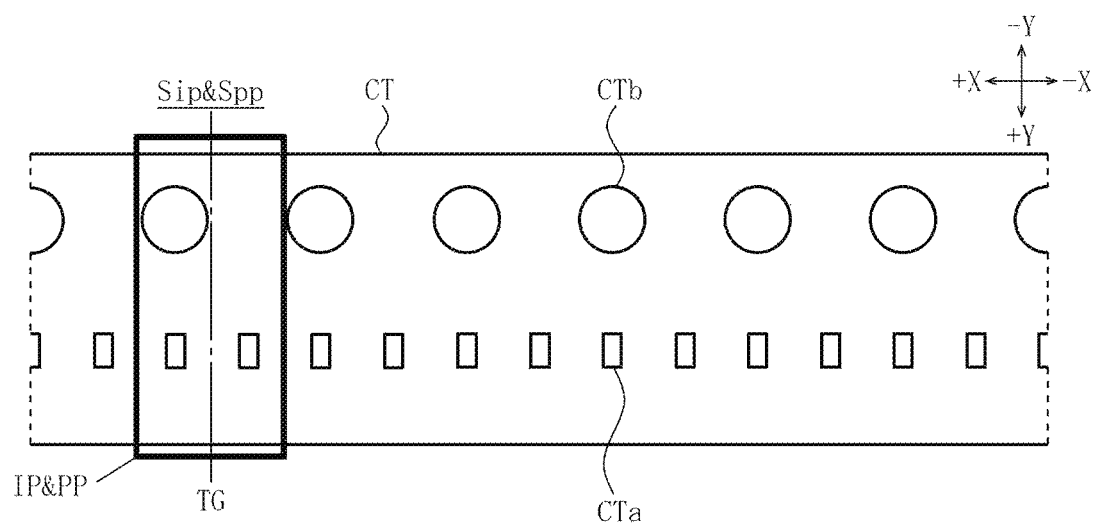
FIG. 10 is an illustrative view of the stop state of the carrier tape at the insertion position and imaging position when two electronic components are collectively inserted into two housing recesses.

FIG. 10 shows the stop states of the carrier tape CT at the insertion position IP and imaging position PP for a case in which two electronic components EC are collectively inserted into two housing recesses CTa. In this case, the carrier tape CT intermittently moves in units of two housing recesses CTa, and thus if the pitch Pa of the housing recesses CTa in the carrier tape CT is ½ of the pitch Pb of the feed holes CTb, then there is only one type of stop state for the insertion position IP of the carrier tape CT (see Sip) and also only one type of stop state for the imaging position PP (see Spp). Even in such a case, the collective insertion of the two electronic components EC can be performed extremely smoothly via the same process in FIG. 9 if common correction amounts corresponding to the two housing recesses CTa are calculated and stored via the same process in FIG. 6.

Figure 11:
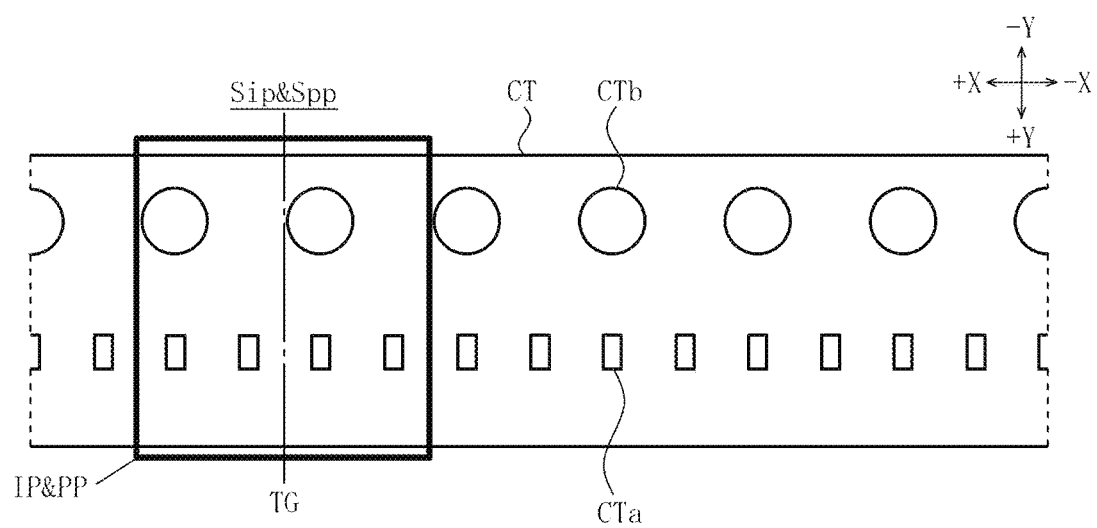
FIG. 11 is an illustrative view of the stop state of the carrier tape at the insertion position and imaging position when four electronic components are collectively inserted into four housing recesses.

FIG. 11 shows the stop states of the carrier tape CT at the insertion position IP and imaging position PP for a case in which four electronic components EC are collectively inserted into four housing recesses CTa. In this case, the carrier tape CT intermittently moves in units of four housing recesses CTa, and thus if the pitch Pa of the housing recesses CTa in the carrier tape CT is ½ of the pitch Pb of the feed holes CTb, then there is only one type of stop state for the insertion position IP of the carrier tape CT (see Sip) and also only one type of stop state for the imaging position PP (see Spp). Furthermore, the image obtained at the imaging position PP will always contain two feed holes CTb, and thus the two-dimensional position of one feed hole CTb among the two feed holes CTb is set as the origin (X0,Y0) in the XY coordinate system. Even in such a case, the collective insertion of the four electronic components EC can be performed extremely smoothly via the same process in FIG. 9 if common correction amounts corresponding to the four housing recesses CTa are calculated and stored via the same process in FIG. 6.

Figure 12:
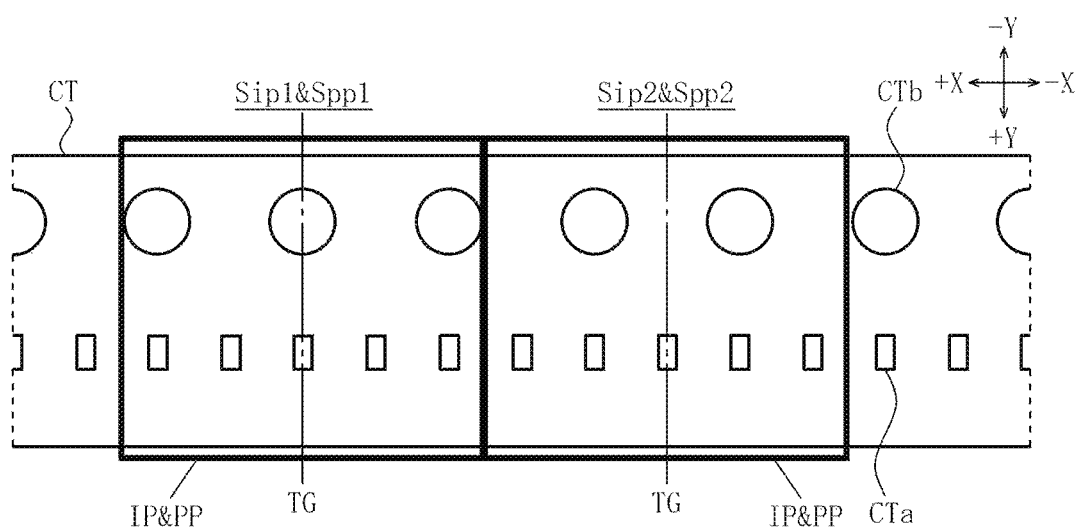
FIG. 12 is an illustrative view of the stop states of the carrier tape at the insertion position and imaging position when five electronic components are collectively inserted into five housing recesses.

FIG. 12 shows the stop states of the carrier tape CT at the insertion position IP and imaging position PP for a case in which five electronic components EC are collectively inserted into five housing recesses CTa. In this case, the carrier tape CT intermittently moves in units of five housing recesses CTa, and thus if the pitch Pa of the housing recesses CTa in the carrier tape CT is ½ of the pitch Pb of the feed holes CTb, then there are two types of stop states for the insertion position IP of the carrier tape CT (see Sip1 and Sip2) and also two types of stop states for the imaging position PP (see Spp1 and Spp2). Furthermore, there is a case in which the image obtained at the imaging position PP will contain three feed holes CTb (see Spp1) and a case in which the image will contain two feed holes CTb (see Spp2), and thus the two-dimensional position of one feed hole CTb among the three feed holes CTb and the two-dimensional position of one feed hole CTb among the two feed holes CTb are set as the origin (X0,Y0) in the respective XY coordinate systems. Even in such a case, the collective insertion of the five electronic components EC can be performed extremely smoothly via the same process in FIG. 9 if common correction amounts corresponding to the five housing recesses CTa are calculated and stored via the same process in FIG. 6.

Figure 13:
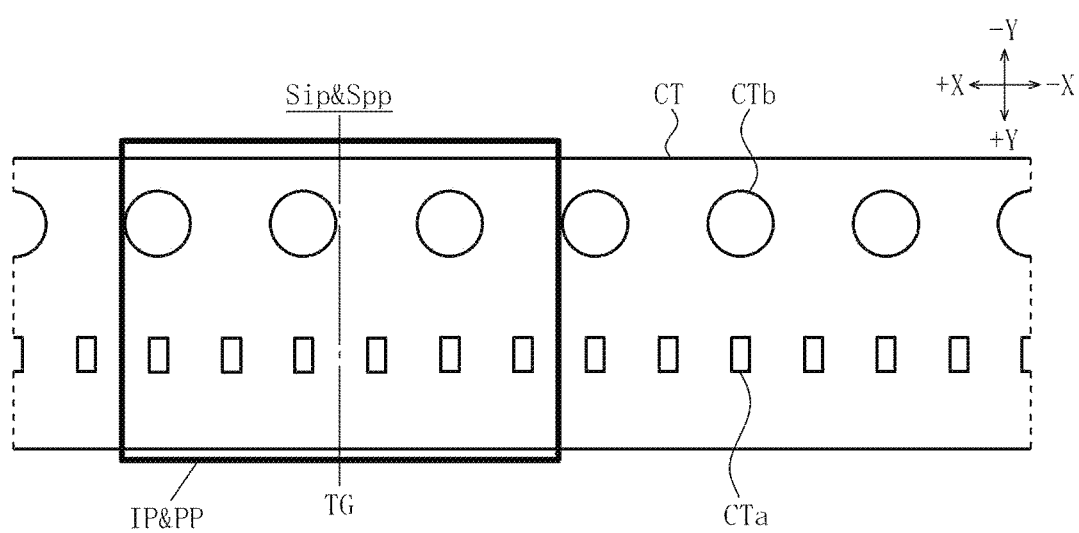
FIG. 13 is an illustrative view of the stop state of the carrier tape at the insertion position and imaging position when six electronic components are collectively inserted into six housing recesses.

FIG. 13 shows the stop states of the carrier tape CT at the insertion position IP and imaging position PP for a case in which six electronic components EC are collectively inserted into six housing recesses CTa. In this case, the carrier tape CT intermittently moves in units of six housing recesses CTa, and thus if the pitch Pa of the housing recesses CTa in the carrier tape CT is ½ of the pitch Pb of the feed holes CTb, then there is only one type of stop state for the insertion position IP of the carrier tape CT (see Sip) and also only one type of stop state for the imaging position PP (see Spp). Furthermore, the image obtained at the imaging position PP will always contain three feed holes CTb, and thus the two-dimensional position of one feed hole CTb among the three feed holes CTb is set as the origin (X0,Y0) in the XY coordinate system. Even in such a case, the collective insertion of the six electronic components EC can be performed extremely smoothly via the same process in FIG. 9 if common correction amounts corresponding to the six housing recesses CTa are calculated and stored via the same process in FIG. 6.

Next, a carrier tape with a different feed hole pitch from the carrier tape shown in FIG. 1A will be explained with reference to FIG. 14.

Figure 14:
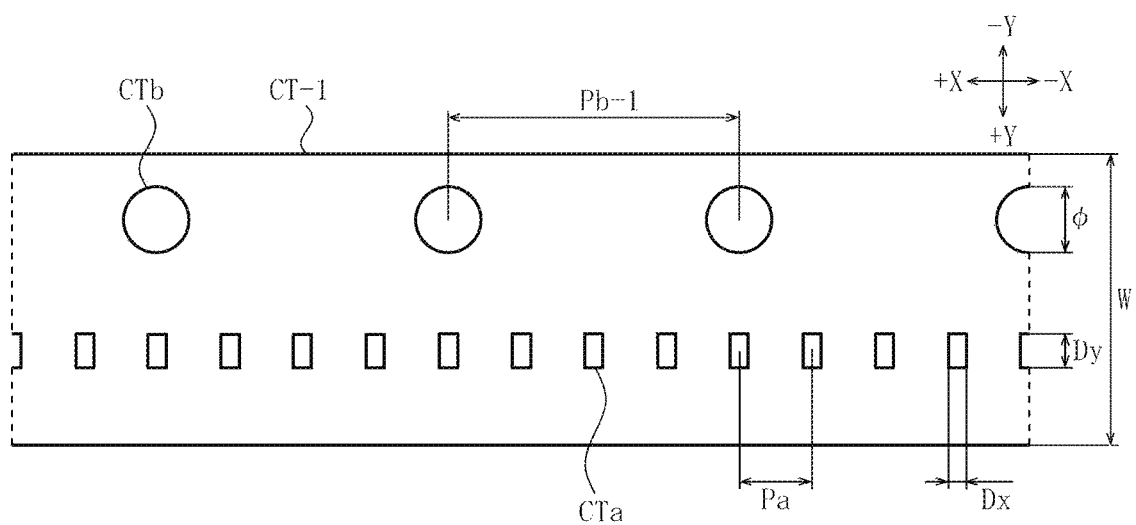
FIG. 14 is a view showing carrier tape with a different feed hole pitch from the carrier tape shown in FIG. 1A.

The carrier tape CT-1 shown in FIG. 14 differs from the carrier tape CT shown in FIG. 1A in that the pitch Pa of the housing recesses CTa are ¼ of the pitch Pb-1 of the feed holes CTb. Due to the carrier tape CT-1 having the pitch Pa of the housing recesses CTa at ¼ of the pitch Pb-1 of the feed holes CTb, it is not always possible to obtain an image containing two or three housing recesses CTa and at least one feed hole CTb when collectively inserting two electronic components EC into two housing recesses CTa or when inserting three electronic components EC into three housing recesses CTa. Accordingly, when collectively inserting two electronic components or collectively inserting three electronic components using such a carrier tape CT-1, an image is obtained that contains one feed hole CTb and four or more housing recesses CTa, for example, and then calculation of the deviation amount and calculation of the common correction amount may be performed for only the two or three housing recesses CTa into which the components are inserted.

Next, the main effects of the aforementioned electronic component insertion device and electronic component insertion method will be described.

(Effect 1)

Each time the carrier tape CT, which moves intermittently in units of n (where n is an integer of two or more), stops, the carrier tape CT is imaged in the imaging area IA containing the n number of housing recesses CTa at the imaging position PP at an upstream side of the insertion position IP, and two-dimensional position detection and deviation amount calculation are performed for each of the n number of housing recesses CTa on the basis of the image obtained by the imaging in order to calculate and successively store a common correction amount ($\Delta X, \Delta Y$) corresponding to the n number of housing recesses CTa. Before the n number of electronic components EC are collectively inserted into the n number of housing recesses CTa at the insertion position IP, the common correction amount ($\Delta X, \Delta Y$) corresponding to the n number of housing recesses CTa is read out, and at least a portion of the carrier tape CT corresponding to the insertion position IP is displaced on the basis of the common correction amount ($\Delta X, \Delta Y$) to make it possible to correct the two-dimensional positions of the n number of housing recesses CTa. In other words, even if there is variation in the two-dimensional position of each of the n number of housing recesses CTa, and even if the electronic components EC are small, it is possible to perform extremely smooth collective insertion of the n number of electronic components EC into the n number of housing recesses CTa.

(Effect 2)

The imaging area IA contains at least one feed hole CTb in addition to the n number of housing recesses CTa, and the two-dimensional position of the feed hole CTb is used as a reference when calculating the deviation amounts of the two-dimensional positions of each of the n number of housing recesses CTa. In other words, the protrusions 11a of the intermittent moving sprocket 11, which performs intermittent moving of the carrier tape CT, engage with the feed hole CTb in the carrier tape CT; thus, it is easier to ascertain variation in the two-dimensional position of each of the housing recesses CTa when using the two-dimensional position of the feed hole CTb as a reference, and also more suitable for performing calculation of the deviation amount and calculation of the common correction amount.

(Effect 3)

Even if the number n of the electronic components EC to be collectively inserted is modified, it is still possible to perform detection of the two-dimensional position of the n number of feed holes CTb, calculation of the deviation amount, and calculation of the common correction amount in the same manner as above, and therefore it is possible to perform extremely smooth collective insertion of the n number of electronic components EC into the n number of housing recesses CTa.

(Effect 4)

By combining the aforementioned electronic component insertion device and electronic component insertion method with a cover tape adhering device and cover tape adhering method whereby cover tape for closing the housing recesses CTa after the electronic components EC are inserted is attached by thermal compression bonding etc. of the carrier tape CT, it is possible to provide an electronic component storage tape manufacturing device and electronic component storage device manufacturing method that respectively enable insertion of the electronic components EC into the housing recesses CTa in the carrier tape CT at high efficiency and the manufacturing of electronic component storage tape at high efficiency.

Next, modification examples of the aforementioned electronic component insertion device and electronic component insertion method that can obtain the same effects as above will be described.

Modification Example 1

FIG. 1A shows one example of the carrier tape CT, but as long as the carrier tape has housing recesses CTa for electronic components EC at an equal pitch in the length direction, it is possible to use various types of carrier tape; e.g., a carrier tape with a basic dimension in the Y direction dimension W of 8 mm, a basic dimension of the pitch Pa of the housing recesses CTa of 2 mm, and a basic dimension of the pitch Pb of the feed holes CTb of 4 mm, or a carrier tape in which, for each housing recess CTa, the basic dimension in the Y direction dimension, the basic dimension in the X direction dimension, and the basic dimension (depth) in the direction orthogonal to the Y direction and X direction differs, or the like. Furthermore, FIG. 1B shows one example of an electronic component EC to be inserted, but even if using an electronic component having a basic dimension relationship other than length d1>width d2=height d3, such as an electronic component having a basic dimension relationship of length d1>width d2>height d3 or an electronic component having a basic dimension relationship of length d1>height d3>width d2 or the like, it is still possible to use carrier tape having housing recesses CTa in which such a component can be stored, thereby allowing the component to be inserted to be selected as appropriate.

Modification Example 2

The number n of electronic components EC to be collectively inserted was described as being 2 to 6, but even if the number n of electronic components EC to be inserted is 7 or more, it is still possible to perform extremely smooth collective insertion of the 7 or more electronic components EC by the same process as in FIG. 9 as long as the common correction amounts corresponding to the 7 or more housing recesses CTa are calculated and stored by the same process in FIG. 6.

Modification Example 3

An example was used in which a pattern detection method was used for the detection of the two-dimensional positions of the feed hole CTb and housing recesses CTa in steps ST13 and ST14 in FIG. 6, but a different method capable of detecting two-dimensional positions, such as an edge detection method, for example, can be used as appropriate. When using an edge detection method for the detection of the two-dimensional positions of the feed hole CTb and housing recesses CTa, the two-dimensional position of each is detected by searching at least three spots on the outline of the feed hole and four spots (two sides in the X direction and two sides in the Y direction) on the outline of the housing recesses CTa.

Modification Example 4

As the calculation method of the deviation amount in step ST15 in FIG. 6, a method was illustrated in which the deviation amount of the two-dimensional position of each housing recess CTa is calculated while using the two-dimensional position of the feed hole CTb as a reference, but a different deviation amount calculation method can be used as appropriate, such as method whereby, instead of detecting the two-dimensional position of the feed hole CTb in step ST13. a reference point is set in advance in the imaging area IA and the deviation amount of the two-dimensional position of each housing recess CTa is calculated on the basis of this reference point, or a method whereby a reference point is set in the image obtained by imaging and the deviation amount of the two-dimensional position of each housing recess CTa is calculated on the basis of this reference point, or a method whereby the deviation amount of the two-dimensional position of each housing recess CTa is calculated on the basis of the relative positions of the housing recesses CTa detected in step ST14, or the like, for example.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A device for inserting a plurality of electronic components into a plurality of housing recesses of a carrier tape, the housing recesses being provided at an equal pitch in a lengthwise direction of the carrier tape, the device being configured to insert n number of the electronic components into n number of the housing recess in the carrier tape at once, where n is an integer of two or more, the device comprising:
   a motor that intermittently moves the carrier tape such that every n number of the housing recesses is positioned at an insertion position at once so as to receive n number of the electronic components into the n number of the housing recesses at once at the insertion position;
   an imaging device that images, at an imaging position provided at an upstream side of the insertion position, a portion of the carrier tape that contains the n number of housing recesses that are to be inserted with n number of the electronic components at once when moved to the insertion position; and
   a processor that determines, on the basis of an image captured by the imaging device, a two-dimensional position of each of the n number of housing recesses contained in the image relative to a reference point in the image, and calculates a positional deviation in the two-dimensional position of each of the n number of housing recesses from a prescribed design position, the processor further deriving common correction values that are to be applied commonly to the n number of the housing recesses in the image in accordance with the calculated positional deviations,
   wherein the processor further causes a two-dimensional position of the insertion position for the n number of the housing recesses that have been imaged by the imaging device to be corrected in accordance with the derived common correction values so as to mitigate or offset the positional deviations of the n number of the housing recesses before the n number of the housing recesses receive the n number of the electronic components so that the n number of the electronic components are inserted into the n number of the housing recesses at the corrected insertion position.

2. The device according to claim 1,
   wherein the carrier tape has feed holes in the length direction at an equal pitch that is different from the pitch of the housing recesses,
   wherein the motor intermittently moves the carrier tape by intermittently rotating a sprocket with teeth that engage with feed holes of the carrier tape, and
   wherein the device further comprises a driving unit that moves a two-dimensional position of the sprocket in the length direction and a width direction of the carrier tape, and the processor causes the driving unit to move the two dimensional position of the sprocket in correcting the insertion position.

3. The device according to claim 2,
   wherein said portion of the carrier tape imaged by the imaging device further contains at least one feed hole at the imaging position,
   wherein the reference point with respect to which the two-dimensional position of each of the n number of housing recesses is determined by the processor is a two-dimensional position of the at least one feed hole contained in the image of the carrier tape.

4. The device according to claim 3, wherein the carrier tape is configured such that two or more of the feed holes are contained in at least some of the imaged portions of the carrier tape containing the n number of the housing recesses, and the reference point with respect to which the two-dimensional position of each of the n number of the housing recesses is determined by the processor is a two-dimensional position of the feed hole that is located at a most downstream side in the image of the carrier tape.

5. The device according to claim 3, wherein the imaging device is configured such that the imaged portion of the carrier tape contains n+1 or more housing recesses, and the processor calculates the positional deviation for only n number of the housing recesses designated among the n+1 or more housing recesses.

6. The device according to claim 1, wherein n is a number in a range of 2 to 6.

7. The device according to claim 1, wherein the housing recesses have a generally cuboid shape.

8. The device according to claim 1, wherein the electronic component has a maximum basic dimension of 0.6 mm or lower.

9. A method for inserting a plurality of electronic components into a plurality of housing recesses of a carrier tape, the housing recesses being provided at an equal pitch in a lengthwise direction of the carrier tape, the method being for inserting n number of the electronic components into n number of the housing recess in the carrier tape at once, where n is an integer of two or more, the method comprising:

intermittently moving the carrier tape by a motor such that every n number of the housing recesses is positioned at an insertion position at once so as to receive n number of the electronic components into the n number of the housing recesses at once at the insertion position;

imaging by an imaging device, at an imaging position provided at an upstream side of the insertion position, a portion of the carrier tape that contains the n number of housing recesses that are to be inserted with n number of the electronic components at once when moved to the insertion position;

determining by a processor, on the basis of an image captured by the imaging device, a two-dimensional position of each of the n number of housing recesses contained in the image relative to a reference point in the image;

calculating by the processor a positional deviation in the two-dimensional position of each of the n number of housing recesses from a prescribed design position;

deriving by the processor common correction values that are to be applied commonly to the n number of the housing recesses in the image in accordance with the calculated positional deviations; and causing by the processor a two-dimensional position of the insertion position for the n number of the housing recesses that have been imaged by the imaging device to be corrected in accordance with the derived common correction values so as to mitigate or offset the positional deviations of the n number of the housing recesses before the n number of the housing recesses receive the n number of the electronic components so that the n number of the electronic components are inserted into the n number of the housing recesses at the corrected insertion position.

10. The method according to claim 9,
wherein the carrier tape has feed holes in the length direction at an equal pitch that is different from the pitch of the housing recesses,
wherein in intermittently moving the carrier tape by the motor, the method includes intermittently rotating a sprocket with teeth that engage with feed holes of the carrier tape, and
wherein in causing the two-dimensional position of the insertion position to be corrected, the method includes causing by the processor a driving unit to move a two-dimensional position of the sprocket in the length direction and a width direction of the carrier tape.

11. The method according to claim 10,
wherein said portion of the carrier tape imaged by the imaging device further contains at least one feed hole at the imaging position,
wherein the reference point with respect to which the two-dimensional position of each of the n number of housing recesses is determined by the processor is a two-dimensional position of the at least one feed hole contained in the image of the carrier tape.

12. The method according to claim 11, wherein the carrier tape is configured such that two or more of the feed holes are contained in at least some of the imaged portions of the carrier tape containing the n number of the housing recesses, and the reference point with respect to which the two-dimensional position of each of the n number of the housing recesses is determined by the processor is a two-dimensional position of the feed hole that is located at a most downstream side in the image of the carrier tape.

13. The device according to claim 11, wherein the imaging device is configured such that the imaged portion of the carrier tape contains n+1 or more housing recesses, and in calculating by the processor the positional deviation, the method includes calculating the positional deviation for only n number of the housing recesses designated among the n+1 or more housing recesses.

14. The method according to claim 9, wherein n is a number in a range of 2 to 6.

15. The method according to claim 9, wherein the housing recesses have a generally cuboid shape.

16. The device according to claim 9, wherein the electronic component has a maximum basic dimension of 0.6 mm or lower.

* * * * *